(12) United States Patent
Zhang

(10) Patent No.: US 7,497,717 B2
(45) Date of Patent: Mar. 3, 2009

(54) LAND GRID ARRAY CONNECTOR HAVING IMPROVED COVER

(75) Inventor: Jie-Feng Zhang, ShenZhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/069,242

(22) Filed: Feb. 7, 2008

(65) Prior Publication Data

US 2008/0220643 A1 Sep. 11, 2008

(30) Foreign Application Priority Data

Feb. 8, 2007 (CN) .................... 2007 2 0034625

(51) Int. Cl.
*H01R 13/62* (2006.01)
(52) U.S. Cl. ........................ 439/331; 439/73
(58) Field of Classification Search ................ 439/331, 439/330, 73, 525, 526
See application file for complete search history.

(56) References Cited

U.S. PATENT DOCUMENTS

| | | | |
|---|---|---|---|
| 6,692,279 B1 * | 2/2004 | Ma | 439/331 |
| 6,722,909 B1 * | 4/2004 | McHugh et al. | 439/331 |
| 6,758,691 B1 * | 7/2004 | McHugh et al. | 439/331 |
| 6,974,345 B2 | 12/2005 | Yang et al. | |
| 7,101,210 B2 * | 9/2006 | Lin et al. | 439/331 |
| 2007/0020963 A1 | 1/2007 | Ma et al. | |

* cited by examiner

*Primary Examiner*—Hien Vu
(74) *Attorney, Agent, or Firm*—Wei Te Chung

(57) ABSTRACT

An LGA connector (100) adapted for receiving an electronic package (10), includes a housing (2) and a number of contacts received in the housing, a stiffener (3) enclosing the housing, a cover (5) pivotable between an open position and a closed position, and a lever (4) adapted for retaining the cover. The cover includes a pair of opposite first edges (53) each having a pair of resisting beams (531) extending toward opposite directions and projecting toward the housing. The resisting beams resiliently resist against the electronic package when the cover is rotated to the closed position.

11 Claims, 3 Drawing Sheets

LAND GRID ARRAY CONNECTOR HAVING IMPROVED COVER

BACKGROUND OF THE INVENTION

1. Field of the Invention

The present invention relates to an electrical connector, and particularly to a land grid array (LGA) connector for electrically connecting with an electronic package such as an IC package.

2. Description of Related Art

A land grid array connector electrically connecting an IC package is described in U.S. Pat. No. 6,974,345 issued on Dec. 13, 2005 or U.S. Patent Publication No. 2007/0020963 published on Jan. 25, 2007. The connector comprises a stiffener having a front wall and a rear wall, a housing received within the stiffener for supporting the IC package, a plurality of contacts retained within the housing in contact with the IC package, a cover and a lever respectively rotatably mounted on the rear wall and the front wall of the stiffener. The cover comprises a window defined in center thereof for partially exposing the IC package and four side edges surrounding the window for confining the IC package.

The IC package could not be fixed in the stiffener firmly.

Hence, an improved land grid array connector is required to overcome the above-mentioned disadvantages of the related art.

SUMMARY OF THE INVENTION

An object of the present invention is to provide a land grid array connector firmly fixing the IC package.

To achieve the aforementioned objects, an LGA connector adapted for receiving an IC package comprises a housing and a plurality of contacts received in the housing, a stiffener enclosing the housing, a cover mounted on the stiffener and pivotable between an open position and a closed position, and a lever pivotably mounted on the stiffener to retain the cover. The cover comprises a pair of opposite first edges each having a pair of symmetrical resisting beams extending toward opposite directions and projecting toward the housing. The resisting beams resiliently resist against the IC package when the cover is rotated to the closed position.

The pair of resisting beams are symmetrically formed and resiliently resist against the IC package to thereby provide a balanceable resilient force to fix the IC package firmly.

Other objects, advantages and novel features of the invention will become more apparent from the following detailed description of a preferred embodiment when taken in conjunction with the accompanying drawings.

DETAILED DESCRIPTION OF THE INVENTION

Figure 1:
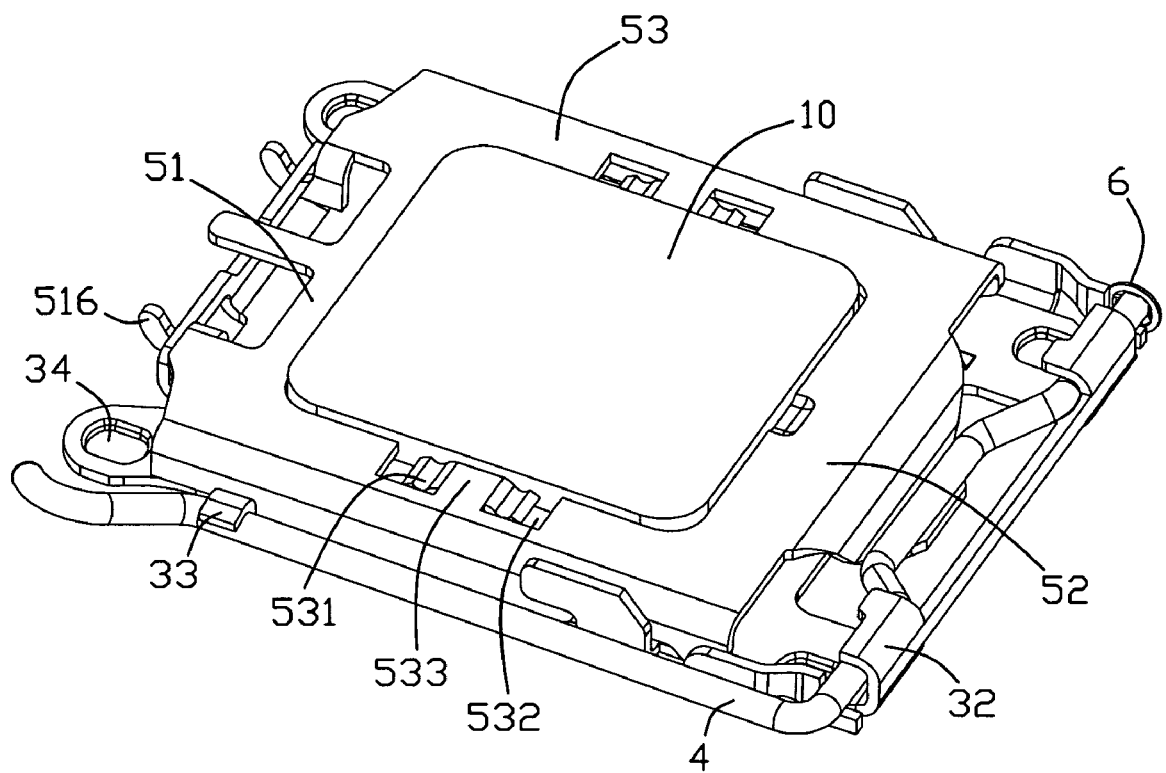
FIG. 1 is an assembled perspective view of an LGA connector in accordance with the present invention.
Figure 2:
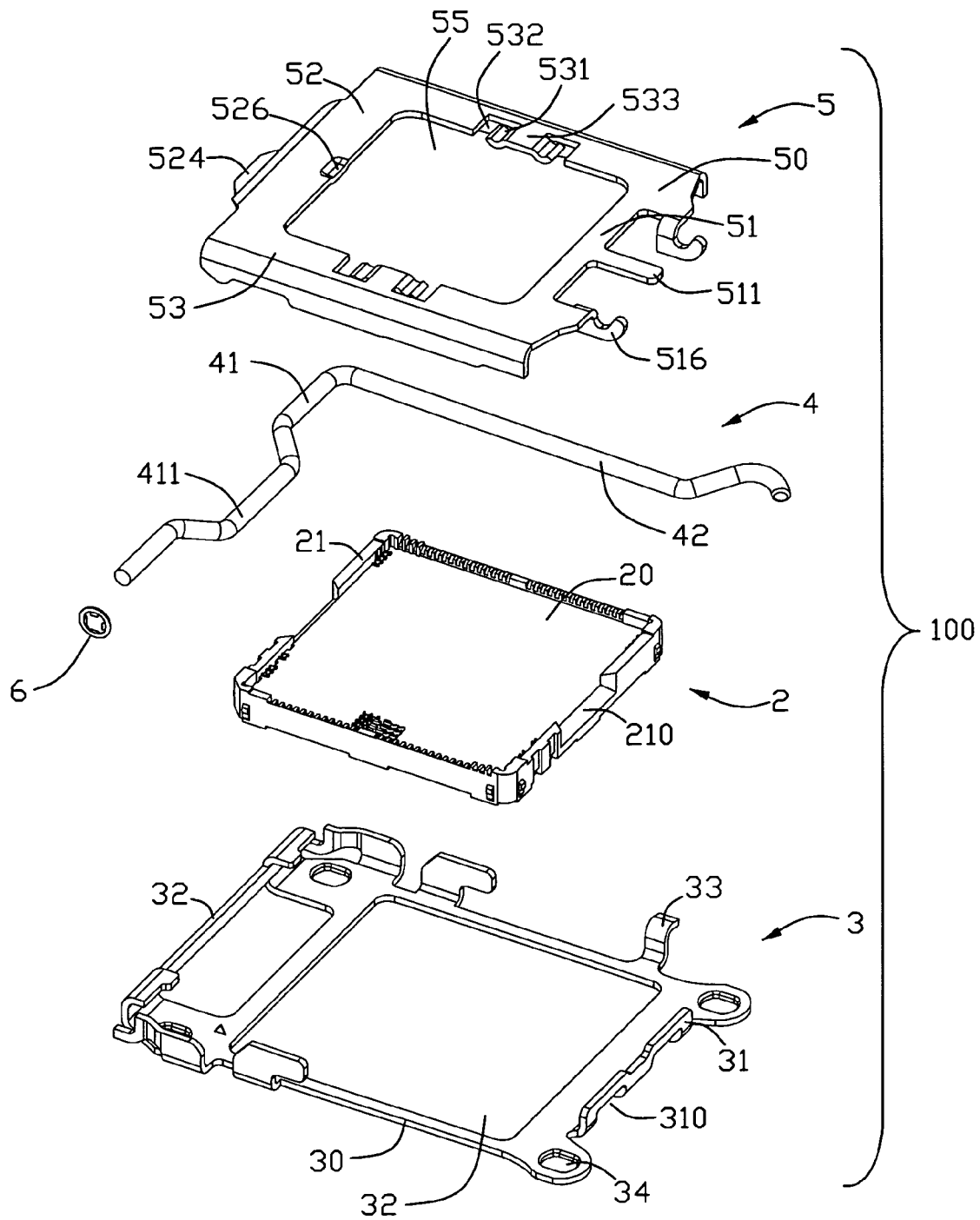
FIG. 2 is an exploded perspective view of the LGA connector as shown in FIG. 1.
Figure 3:
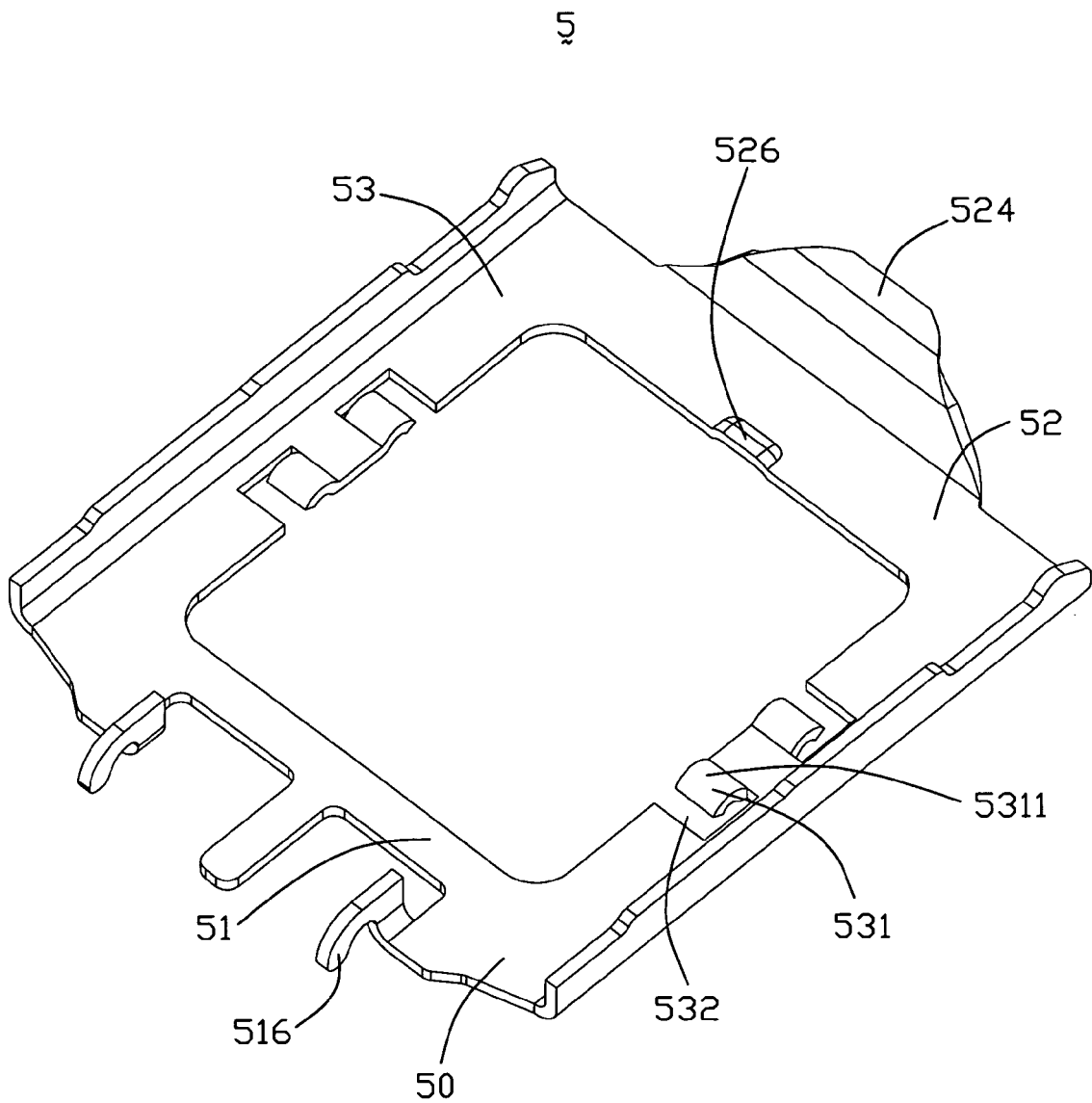
FIG. 3 is a perspective view of a cover as shown in FIG. 2.

Reference will now be made to the drawing figures to describe the present invention in detail. Referring to FIGS. 1-3, an LGA connector 100 in accordance with the preferred embodiment of the present invention is adapted for electrically connecting with an IC package 10. The LGA connector 100 comprises a housing 2, a plurality of contacts (not shown) inserted within the housing 2, a stiffener 3, a lever 4, a cover 5 and a ring 6.

Referring to FIG. 2, the housing 2 is of a rectangular configuration and comprises a conductive region 20, a pair of opposite supporting walls 21 each defining a cutout 210 for easing the removal of the IC package 10.

The stiffener 3 comprises a body portion 30, a first window 32 defined in a center of the body portion 30, a front wall 32, a rear wall 31 defining a pair of slots 310, a latch 33 formed on a side edge of the body portion 30, and four mounting holes 34 defined at four corner portions thereof for insertion of screws (not shown).

Referring to FIGS. 2-3, the cover 5 comprises a primary plate 50 and a second window 55 defined in a center of the primary plate 50. The primary plate 50 has a front edge 52, a rear edge 51 opposite to the front edge 52, a pair of opposite periphery edges 53 interconnected together to surround the second window 55. The front edge 52 has a tongue portion 524 extending forwardly therefrom and a protrusion 526 projecting toward the housing 2. The rear edge 51 has a pair of symmetrical hooks 516 and a tail portion 511 formed between the pair of hooks 516.

Each periphery edge 53 has a pair of indentations 532, an intermediate portion 533 formed between the pair of indentations 532 and a pair of symmetrically extending engaging beams 531 respectively formed in the indentations 532. Each engaging beam 531 bends downwardly and then tilts upwardly to form an arc-like face 5311 projecting toward the stiffener 3 for resisting against the IC package 10. The pair of engaging beams 531 have a same configuration and extend toward opposite directions. In this embodiment, the pair of engaging beams 531 are respectively connected to the opposite edges of the intermediate portion 533. Optionally, the pair of engaging beams 531 could be separated from the opposite edges of the intermediate portion 533. The pair of engaging beams 531 could have different length, or project a different dimension toward the stiffener 3. Further more, more engaging beams 531 could be provided at other portions of the cover 5.

The lever 4 comprises a shaft 41 and an actuator 42 perpendicular to the shaft 41 to thereby form the lever as a L-shape. The shaft 41 has an U-shaped bending portion 411 bending inwardly from a middle portion thereof.

Referring to FIGS. 1-3, in assembly of the LGA connector 100, the plurality of contacts are pre-loaded within the housing 2. The housing 2 together with the contacts is then mounted within the first window 32 of the stiffener 3. The cover 5 is assembled to the rear wall 31 of the stiffener 3. The hooks 516 of the cover 5 are inserted in the slots 310 to make the cover 5 pivotable around the rear wall 31. The tail portion 511 is disposed above the rear wall 31 for preventing an excessive rotation of the cover 5.

The shaft 41 of the lever 4 is assembled to the front wall 32, with the bending portion 411 depressing the tongue portion 524 of the cover 5. The ring 6 is assembled to a free end of the shaft 41 of the lever 4.

In operation, when the lever 4 is rotated upwardly to an open position due to an external force exerted thereon, the tongue portion 524 of the cover 5 is released by the bending portion 411 and the cover 5 is rotated to the open position. The IC package 10 is mounted on the conductive region 20 of the housing 2 and would be electrically connected to a circuit board (not shown) via the contacts. When the cover 5 is rotated to a horizontal closed position, the actuator 4 is driven to the horizontal closed position, with the tongue portion 524 depressed by the bending portion 411 of the lever 4. The actuator 42 engages with latch 33 to keep the lever 4 together with the cover 5 in the horizontal closed position.

At the same time, the engaging beams 531 and the protrusion 526 resist against the IC package 10 to provide a reliable and stable resilient force to fix the IC package 10 firmly.

However, the disclosure is illustrative only, changes may be made in detail, especially in matter of shape, size, and arrangement of parts within the principles of the invention.

What is claimed is:

1. A land grid array connector adapted for receiving an electronic package, comprising:
    a housing and a plurality of contacts received in the housing;
    a stiffener receiving the housing;
    a metallic cover mounted on the stiffener and pivotable between an open position and a closed position, said cover comprising a pair of opposite first edges, each first edge having a pair of resisting beams extending toward opposite directions and projecting toward the housing, said resisting beams resiliently resisting against an electronic package when the cover is rotated to the closed position; and
    a lever pivotably mounted on the stiffener to retain the cover;
    wherein said resisting beam bends downwardly and then tilts upwardly to form an arc-like face projecting toward the housing;
    wherein said first edge defines a pair of indentations accommodating said resisting beams and an intermediate portion disposed between the pair of indentations;
    wherein said pair of resisting beams are connected to opposite edges of the intermediate portion;
    wherein said cover has a protrusion projecting toward the housing for resisting against the electronic package.

2. The land grid array connector as claimed in claim 1, wherein said pair of resisting beams extend away from opposite edges of the intermediate portion.

3. The land grid array connector as claimed in claim 1, wherein said pair of resilient beams have a same length.

4. The land grid array connector as claimed in claim 1, wherein said pair of resilient beams project a same dimension toward the housing.

5. The land grid array connector as claimed in claim 1, wherein said cover comprises a front edge, a rear edge opposite to the front edge, and a pair of opposite periphery edges.

6. The land grid array connector as claimed in claim 5, wherein said pair of first edges constitute the pair of periphery edges.

7. The land grid array connector as claimed in claim 5, wherein said pair of first edges constitute the front and rear edges.

8. The land grid array connector as claimed in claim 1, wherein said stiffener is formed with a rear wall defining a pair of slots, and said cover is provided with a pair of hooks pivotably engaging with the slots.

9. The land grid array connector as claimed in claim 8, wherein said cover has a tail portion disposed between the pair of hooks for preventing an excessive rotation of the cover.

10. The land grid array connector as claimed in claim 1, wherein said cover has a tongue portion, and said lever has a bending portion engaging with the tongue portion at the closed position.

11. The land grid array connector as claimed in claim 1, wherein said housing has a pair of supporting walls each defining a cutout for easing removal of the electronic package.

\* \* \* \* \*